United States Patent
Iwanaga

(10) Patent No.: US 7,815,983 B2
(45) Date of Patent: Oct. 19, 2010

(54) GAS-BARRIER FILM, SUBSTRATE FILM, AND ORGANIC ELECTROLUMINESCENT DEVICE

(75) Inventor: Hiroshi Iwanaga, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 290 days.

(21) Appl. No.: 11/727,380

(22) Filed: Mar. 26, 2007

(65) Prior Publication Data

US 2007/0224430 A1    Sep. 27, 2007

(30) Foreign Application Priority Data

Mar. 27, 2006    (JP)    ............... 2006-084628

(51) Int. Cl.
    *C09K 19/00*    (2006.01)
(52) U.S. Cl. .......... 428/1.26; 428/421; 428/213; 428/387; 428/215; 428/480; 428/1.1; 428/1.6; 349/56; 349/158; 525/437
(58) Field of Classification Search ............. 428/421, 428/427, 213, 387, 215, 480, 1.26, 1.1, 1.6; 349/56, 158; 525/437
    See application file for complete search history.

(56) References Cited

U.S. PATENT DOCUMENTS

| | | | | |
|---|---|---|---|---|
| 3,096,879 | A * | 7/1963 | Schumacher | 206/523 |
| 3,344,973 | A * | 10/1967 | Studen | 206/523 |
| 4,430,493 | A | 2/1984 | Rieder | |
| 4,967,306 | A | 10/1990 | Hampl, Jr. et al. | |
| 5,770,301 | A * | 6/1998 | Murai et al. | 428/213 |
| 5,853,862 | A * | 12/1998 | Murai et al. | 428/215 |
| 5,888,593 | A * | 3/1999 | Petrmichl et al. | 427/563 |
| 6,080,833 | A | 6/2000 | Otsuji et al. | |
| 6,136,444 | A * | 10/2000 | Kon et al. | 428/423.1 |
| 6,268,695 | B1 | 7/2001 | Affinito | |
| 6,322,860 | B1 * | 11/2001 | Stein et al. | 428/1.26 |
| 6,432,516 | B1 * | 8/2002 | Terasaki et al. | 428/195.1 |
| 6,905,769 | B2 * | 6/2005 | Komada | 428/421 |
| 7,288,311 | B2 * | 10/2007 | Kawashima et al. | 428/212 |
| 7,294,517 | B2 * | 11/2007 | Takayama et al. | 438/23 |
| 2001/0031379 | A1 | 10/2001 | Tera et al. | |
| 2002/0022156 | A1 | 2/2002 | Bright | |
| 2002/0102367 | A1 | 8/2002 | Shimodaira et al. | |

(Continued)

FOREIGN PATENT DOCUMENTS

DE    3434286    5/1985

(Continued)

OTHER PUBLICATIONS

Derwent Publications Ltd., London, GB AN 2005-762358, XP002443731.

(Continued)

*Primary Examiner*—Mark Ruthkosky
*Assistant Examiner*—Tamra L Amakwe
(74) *Attorney, Agent, or Firm*—Birch, Stewart, Kolasch & Birch, LLP

(57) ABSTRACT

A gas-barrier film comprising a gas-barrier laminate on a substrate film, wherein the gas-barrier laminate comprises at least one three-layer unit consisting of a silicon oxinitride layer, an organic interlayer and a silicon oxinitride layer disposed in this order being adjacent with each other. The film has excellent transparency, gas-barrier performance and bending resistance.

17 Claims, 2 Drawing Sheets

U.S. PATENT DOCUMENTS

| | | | |
|---|---|---|---|
| 2003/0120008 A1 | 6/2003 | Obayashi et al. | |
| 2004/0052975 A1* | 3/2004 | Komada et al. | 427/574 |
| 2005/0203257 A1* | 9/2005 | Uchida et al. | 525/437 |
| 2006/0093758 A1* | 5/2006 | Sakakura et al. | 428/1.6 |
| 2006/0141645 A1* | 6/2006 | Yamazaki et al. | 438/22 |
| 2006/0226517 A1* | 10/2006 | Iwanaga et al. | 257/639 |
| 2007/0135552 A1* | 6/2007 | Wrosch et al. | 524/443 |

FOREIGN PATENT DOCUMENTS

| | | |
|---|---|---|
| EP | 1 205 772 A2 | 5/2002 |
| JP | 62-273531 A | 11/1987 |
| JP | 06-248063 A | 9/1994 |
| JP | 2000-500792 A | 1/2000 |
| JP | 2000-227603 A | 8/2000 |
| JP | 2001-150584 A | 6/2001 |
| JP | 2002-220564 A | 8/2002 |
| JP | 2003-053881 | 2/2003 |
| WO | WO 97/14739 A1 | 4/1997 |

OTHER PUBLICATIONS

Derwent Publications Ltd., London, GB; AN2006-168119, XP002443732.
Office Action of Aug. 13, 2009 for U.S. Appl. No. 11/483,680.
Office Action of Mar. 11, 2009 for U.S. Appl. No. 11/483,680.
Office Action of Aug. 13, 2009 for U.S. Appl. No. 11/384,399.
Office Action of Mar. 11, 2009 for U.S. Appl. No. 11/384,399.
Office Action of Mar. 11, 2009 for U.S. Appl. No. 11/401,217.
Office Action of Oct. 21, 2009 for U.S. Appl. No. 11/401,217.
Office Action of Jul. 13, 2009 for U.S. Appl. No. 12/004,036.
Office Action of Mar. 2, 2009 for U.S. Appl. No. 12/004,036.
Office Action of Aug. 7, 2008 for U.S. Appl. No. 12/004,036.
Office Action of May 13, 2009 for U.S. Appl. No. 12/004,036.
Office Action of Jun. 20, 2008 for U.S. Appl. No. 11/088,988.
Office Action of Dec. 2, 2008 for U.S. Appl. No. 11/086,988.

* cited by examiner

GAS-BARRIER FILM, SUBSTRATE FILM, AND ORGANIC ELECTROLUMINESCENT DEVICE

BACKGROUND OF THE INVENTION

1. Field of the Invention

The present invention relates to a gas-barrier film, in particular to a laminate-type gas-barrier film favorable for a substrate for various devices and for a coating film for devices, and to an organic electroluminescent device (hereinafter referred to as "organic EL device") that comprises the above gas-barrier film and has good durability and flexibility.

2. Description of the Related Art

Heretofore, a gas-barrier film fabricated by forming a thin metal oxide film of aluminium oxide, magnesium oxide or silicon oxide on the surface of a plastic substrate or a film is widely used for wrapping or packaging articles that require shielding from various gases such as water vapor or oxygen and for wrapping or packaging edibles, industrial articles and medicines for preventing them from being deteriorated. Apart from its applications for wrapping and packaging articles, in addition, the gas-barrier film is being used for substrates for liquid-crystal display devices, solar cells and EL devices. In particular, a transparent substrate that is being much used for liquid-crystal display devices and EL devices is required to be lightweight and has a large panel and, in addition, it is further required to satisfy high-level performance ability in that it has long-term reliability and has a lot of latitude in designing its shape and that it enables curved-face display.

Recently, in the field of liquid-crystal display devices and EL devices, a film substrate of transparent plastics or the like is being used in place of a glass substrate that is heavy and readily cracked or broken and hardly worked into a large-size panel. In addition, since the film substrate of transparent plastics or the like satisfies the above-mentioned requirements and since it is applicable to a roll-to-roll system, it is more advantageous than glass in that the producibility with it is high and the production cost with it is low. However, the film substrate of transparent plastics or the like is problematic in that its gas-barrier property is not good as compared with that of glass. When a substrate having a poor gas-barrier property is used, water vapor and air may penetrate through it; and, for example, when it is used in liquid-crystal display devices, the liquid crystal in the liquid-crystal cell may be degraded and the degraded part may be a display failure, thereby worsening the display quality of the devices.

For solving the problem, it is known to form a thin metal oxide film on the above-mentioned film substrate, thereby using the resulting gas-barrier film as a transparent substrate. As a gas-barrier film for use in wrapping materials and liquid-crystal display devices, there are known a plastic film coated with silicon oxide through vapor deposition (for example, see JP-B-53-12953, pp. 1-3), and a plastic film coated with aluminium oxide through vapor deposition (for example, see JP-A-58-217344, pp. 1-4). These have a water-vapor barrier level of 1 g/m²·day or so. However, with recent development of large-panel liquid-crystal display devices and high-definition display devices, the film substrate is being required to have a water-vapor barrier level of 0.1 g/m²·day or so.

Extremely recently, the development of organic EL devices and high-definition color liquid-crystal display devices that are required to have a higher gas-barrier level is being further promoted, and a substrate that keeps a transparency applicable to them and has a higher gas-barrier level, especially a higher water-vapor barrier level of not more than 0.1 g/m²·day is being required.

To satisfy these requirements, some methods expected to produce a higher gas-barrier level have been investigated, for example, a sputtering method of forming a thin film by the use of a plasma generated through glow discharge under low pressure, and a CVD method for film formation. In addition, an attempt to change laminate structure formation to attain a desired result is tried (for example, see JP-A-2003-206361, pp. 2-3).

However, when a film substrate is used, the substrate temperature is limited in layer formation thereon, and therefore a barrier layer having a sufficiently dense and tight structure could not be formed, and a film having a satisfactory barrier property capable of satisfying the requirements could not as yet be formed.

As a thin-film material having a good barrier property, a silicon nitride and a silicon oxinitride are used, and laminating them is tried. For example, U.S. Pat. No. 6,413,645B1 (p. 4 [2-54] to p. 8 [8-22]) describes a barrier film fabricated by laminating, on a substrate film, two layers of a silicon oxinitride having a different nitrogen/oxygen constitution ratio. However, the constitution could not satisfy both a sufficient gas-barrier level and a bending resistance which the film substrate must have in its use, and further technical improvement on it is desired.

On the other hand, a technique of producing a barrier film having an alternate laminate structure of an organic layer/inorganic layer according to a vacuum evaporation method is proposed (for example, see Affinito et al., Thin Solid Films, 1996, P. 290-291 (pp. 63-67)), and it gives a barrier film necessary for a film substrate for organic EL devices.

However, the adhesiveness between the organic layer and the inorganic layer is not always satisfactory, and a multilayered structure of at least 6 layers is needed for providing a high-reliability barrier film for organic EL devices. To that effect, it is difficult to satisfy both the good performance and the high throughput, and development of a novel film-forming system suitable to a continuous film-forming process is desired.

SUMMARY OF THE INVENTION

For solving the above-mentioned various problems, an object of the invention is to provide a high-performance gas-barrier film suitable to continuous film formation and having high producibility; and another object of the invention to provide a highly-durable and flexible organic EL device free from a problem of image quality degradation even in long-term use.

We, the present inventors have assiduously studied and, as a result, have found that the above-mentioned problems can be solved by the following constitutions:

[1] A gas-barrier film comprising a substrate film and a gas-barrier laminate on the substrate film, wherein the gas-barrier laminate comprises at least one three-layer unit consisting of a silicon oxinitride layer, an organic interlayer and a silicon oxinitride layer disposed in this order being adjacent with each other.

[2] The gas-barrier film of [1], which has a water-vapor permeability at 40° C. and a relative humidity 90% of at most 0.01 g/m²·day.

[3] The gas-barrier film of [1] or [2], wherein the substrate film comprises a polymer material having a glass transition temperature of 120° C. or higher.

[4] The gas-barrier film of any one of [1] to [3], wherein the organic interlayer contains silicon and oxygen.

[5] The gas-barrier film of [4], wherein at least one layer of the silicon oxinitride layers or the organic interlayer is formed through inductively-coupled plasma CVD.

[6] The gas-barrier film of anyone of [1] to [5], wherein the constitution ratio of oxygen to nitrogen (oxygen/nitrogen) in at least one layer of the silicon oxinitride layers is from 0.2 to 5.

[7] The gas-barrier film of [6], wherein the organic interlayer contains silicon.

[8] The gas-barrier film of [6], wherein the organic interlayer comprises a cured acrylate compound.

[9] The gas-barrier film of any one of [1] to [8], wherein a transparent conductive layer is provided on the gas-barrier laminate.

[10] The gas-barrier film of any one of [1] to [9], which is produced according to a process where the substrate film is fed in a roll-to-roll system and the gas-barrier laminate is continuously formed thereon.

[11] A substrate film for image display devices, which comprises the gas-barrier film of any one of [1] to [10].

[12] An organic electroluminescent device, which comprises the substrate film for image display devices of [11].

[13] An organic electroluminescent device fabricated by forming a film of the organic electroluminescent device of [12], then providing, in an vacuum not exposing it to air, at least one three-layer unit consisting of a silicon oxinitride layer, an organic interlayer and a silicon oxinitride layer disposed in this order being adjacent with each other, and sealing it up.

The invention provides a gas-barrier film according to a production process suitable to continuous film formation and having high producibility. The invention also provides a highly-durable and flexible organic EL device free from a problem of image quality degradation even in long-term use.

Figure 1:
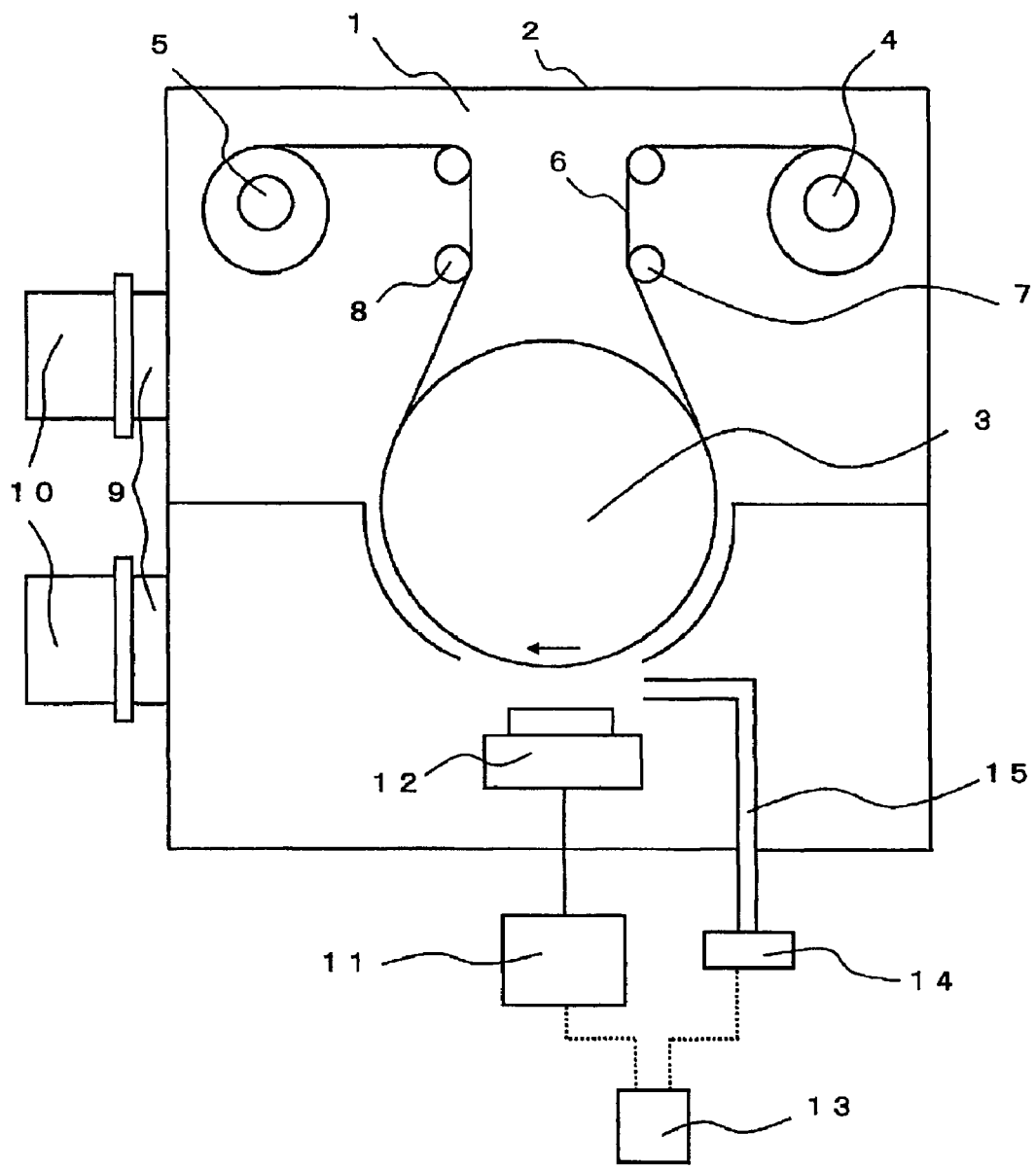
FIG. 1 is an explanatory view showing an inductively-coupled plasma CVD device used for producing samples Nos. 1 to 14, 16 and 17.

In these drawings, 1 is an inductively-coupled plasma CVD device, 2 is a vacuum chamber, 3 is a drum, 4 is a feed-out roll, is a take-up roll, 6 is a plastic film, 7 is a guide roll, 8 is a guide roll, 9 is a vent, 10 is a vacuum pump, 11 is an RF power source (with auto-matcher), 11' is a discharge power source, 12 is an induction coil, 12' is a cathode, 13 is a controller, 14 is a gas flow rate control unit, 15 is a duct.

BEST MODE FOR CARRYING OUT THE INVENTION

The gas-barrier film of the invention is described in detail hereinunder. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

Gas-Barrier Film:

The gas-barrier film of the invention is characterized in that the gas-barrier laminate formed on the substrate film has at least one three-layer unit consisting of a silicon oxinitride layer, an organic interlayer and a silicon oxinitride layer disposed in this order being adjacent with each other. The silicon oxinitride layer as referred to herein means a layer that comprises silicon, oxygen and nitrogen as the essential ingredients thereof; and the organic interlayer means a layer containing a carbon atom. The organic interlayer is preferably a silicon oxide organic layer comprising carbon, hydrogen, oxygen and silicon as the essential ingredients thereof. The essential ingredient as referred to herein means as follows: In the silicon oxinitride layer, the total of silicon, oxygen and nitrogen elements, and in the silicon oxide organic layer, the total of silicon, oxygen and carbon elements are preferably at least 90% by mass of all the elements constituting the entire layer, more preferably at least 95% by mass, even more preferably at least 98% by mass. If desired, the gas-barrier film of the invention may be provided with any other organic layers and functional layers such as protective layer, moisture-absorptive layer, antistatic layer.

Silicon Oxinitride Layer:

The silicon oxinitride in the silicon oxinitride layer is a composition of which the essential constitutive elements are silicon, oxygen and nitrogen. Preferably, except the above-mentioned elements, the minor constitutive elements of hydrogen and carbon that may be taken into the layer from the film-forming material and from the substrate and the ambient atmosphere is less than 5% each. The constitution ratio of silicon, oxygen and nitrogen that constitute the silicon oxinitride in the invention is preferably as follows: In case where the constitution formula is represented by $SiO_xN_y$, x/y is preferably from 0.2 to 5.0. When x/y is at most 5, then the film may more readily have a sufficient gas-barrier performance. When x/y is at least 0.2, then the layer may be hardly peeled from the adjacent organic interlayer, and therefore the film may be favorably applicable to roll conveyance and to bent sites. The value of x/y is more preferably from 0.33 to 2.0, most preferably from 0.5 to 1. The values of x and y are preferably so combined that (2x+3y)/4 could be from 0.8 to 1.1. When the combination value is at least 0.8, then the film is hardly discolored and its application may be broadened. When the combination value is at most 1.1, then the constitutive element proportion of silicon, nitrogen and oxygen may be high and the fault ratio of the film may be reduced and the film may be expected to have a more sufficient gas-barrier performance. More preferably, the combination value (2x+3y)/4 is from 0.9 to 1.1. In particular, when the value is from 0.95 to 1.0, then it is the most favorable since the visible light transmittance of the film may be high and the film may have a stable gas-barrier performance.

At least two silicon oxinitride layers between which an organic interlayer is sandwiched in the invention may have the same composition or a different composition. Preferably, at least one of them satisfies the above-mentioned preferred requirements.

The element constitutive ratio in a laminate sample of the invention may be determined according to a known standard method of X-ray photoelectron spectroscopy (XPS) with etching.

Preferably, the refractive index of the silicon oxinitride layer is from 1.7 to 2.1, more preferably from 1.8 to 2.0. Especially in case where the refractive index is from 1.9 to 2.0, it is the most favorable since the visible light transmittance of the film may be high and the film may have a stable gas-barrier performance.

For forming the silicon oxinitride layer in the invention, any method is employable capable of forming the intended thin film. For example, for it, suitable are a sputtering method, a vacuum evaporation method, an ion-plating method, and a plasma CVD method. Concretely, herein employable are the methods described in Japanese Patent No. 3400324, JP-A-2002-322561, JP-A-2002-361774.

The water-vapor permeability at 40° C. and a relative humidity 90% of the gas-barrier film of the invention is, depending on the use of the film, preferably at most 0.1 g/m$^2$·day, more preferably at most 0.05 g/m$^2$·day, even more preferably at most 0.01 g/m$^2$·day.

For producing the gas-barrier film of high gas-barrier ability, having a water-vapor permeability at 40° C. and a relative humidity 90% of at most 0.01 g/m$^2$·day, preferably employed is a film forming method of any of inductively-coupled plasma CVD, or PVD or CVD using a microwave set under an electron cyclotron resonance condition and a magnetic field-applied plasma. Most preferred is a film forming method of inductively-coupled plasma CVD. Inductively-coupled plasma CVD, and CVD with a microwave set under an electron cyclotron resonance condition and a magnetic field-applied plasma (ECR-CVD) may be carried out, for example, according to the methods described in CVD Handbook by the Chemical Engineering Society of Japan, p. 284 (1991). PVD with a microwave set under an electron cyclotron resonance condition and a magnetic field-applied plasma (ECR-PVD) may be carried out, for example, according to the method described in Ono, et al's Jpn. J. Appl. Phys., 23, No. 8, L534 (1984).

The materials to form a silicon oxinitride in the above case of CVD are described. The silicon source may be a vapor source, for example, silane or silicon halide such as typically dichlorosilane, and a liquid source such as hexamethyldisilazane. The nitrogen source may be a vapor source such as nitrogen or ammonia, and a liquid source such as hexamethyldisilazane.

For making the film having a high barrier performance, a combination of a highly-reactive silane gas and nitrogen is most preferred.

The thickness of the silicon oxinitride layer is not specifically defined. However, if the layer is too thick, then it may be cracked by bending stress or the substrate may be warped or deformed with the increase in the internal stress; but if too thin, then the film may be distributed as islands. Anyhow if too thick or too thin, the water-vapor barrier performance of the film may worsen. In particular, this tendency is remarkable in the silicon oxinitride layer.

Accordingly, the thickness of the silicon oxinitride layer is preferably within a range of from 20 to 500 nm each, more preferably from 50 nm to 200 nm, most preferably from 80 to 150 nm. The two or more silicon oxinitride layers that constitute the gas-barrier laminate in the invention may have the same thickness or a different thickness.

Organic Interlayer:

Regarding its essential constitutive elements, the organic interlayer in the invention preferably has a composition essentially comprising carbon, hydrogen, oxygen and silicon. Preferably, the silicon proportion is from 10% to 30%. The materials to form the silicon-containing organic interlayer are the above-mentioned silicon source combined with a carbon source. The carbon source includes hydrocarbon compounds such as methane, ethane, propane, butane, ethylene, toluene, xylene; alcohol compounds such as methanol, ethanol, n-propanol, i-propanol; ketone compounds such as acetone, methyl ethyl ketone; oxirane compound such as ethylene oxide, propylene oxide, oxetane. In addition to these, if desired, also usable are a vapor source such as oxygen and dinitrogen monoxide as an oxygen source; nitrogen and ammonia as a nitrogen source; and hydrogen as a hydrogen source. These may be added to the reaction system either singly or as combined.

In addition, one or more known organosilicon compounds such as hexamethyldisiloxane (HMDSO), 1,1,3,3-tetramethyldisiloxane (TDMSO), tetramethylsilane (TMS), vinyltrimethoxysilane, vinyltrimethylsilane, dimethyldimethoxysilane, tetramethoxysilane (TMOS), methyltrimethoxysilane, dimethyldiethoxysilane, trimethylmethoxysilane, tetraethoxysilane (TEOS), diethyldiethoxysilane, methyldimethoxysilane, methyldiethoxysilane, methyldiethoxysiloxane, normal-methyltrimethoxysilane may be added to the reaction system either singly or as combined. These may be further combined with a vapor source such as oxygen or dinitrogen monoxide serving as an oxygen source. Above all, preferred are TMS and TMOS; and more preferred is TEOS.

The organic interlayer in the invention may be an organic layer that comprises, as the essential ingredient thereof, a polymer obtained through monomer crosslinking. Not specifically defined, the monomer may be any one having a group crosslinkable with UV rays or electron rays, but preferably has an acryloyl group, a methacryloyl group or an oxirane group such as, for example, epoxy(meth)acrylate, urethane (meth)acrylate, isocyanuric acid (meth)acrylate, pentaerythritol (meth)acrylate, trimethylolpropane (meth)acrylate, ethyleneglycol (meth)acrylate, polyester (meth)acrylate. The essential ingredient of the layer is preferably a polymer produced by crosslinking monomers having two or more acryloyl or methacryloyl functional groups among above. Two or more different types of such bifunctional or more poly-functional, acryloyl or methacryloyl group-having monomers may be used as combined; or they may be mixed with a monofunctional (meth)acrylate. From the viewpoint of the curing speed thereof, an acryloyl group-having monomer is most preferable.

We, the present inventors have assiduously studied the monomer selection and, as a result, have found that, when an acryloyl group-having monomer is used, then the organic interlayer formed may have good adhesiveness to the adjacent silicon oxinitride layer and have good properties contributable to the good water-vapor barrier performance of the laminate barrier film even though it does not always contain silicon. To the monomers to be used, the proportion of the acryloyl group-having monomer is preferably from 40 to 100%, more preferably from 60 to 100%, even more preferably from 80 to 100%.

From the viewpoint of the heat resistance and the solvent resistance necessary for display devices, the essential ingredient of the organic interlayer is preferably any of an isocyanuric acid acrylate, an epoxy acrylates and a urethane acrylate having a high crosslinking degree and having a glass transition temperature of not lower than 200° C. Not specifically defined, the thickness of the organic layer is preferably from 10 nm to 5000 nm, more preferably from 20 to 2000 nm, most preferably from 50 nm to 500 nm. If the organic layer is too thin, then it could hardly have a uniform thickness and could not efficiently cancel the structural defect of the adjacent inorganic layers, and if so, the barrier performance of the film could not be enhanced. On the contrary, if the organic layer is too thick, then it may be readily cracked by external force such as bending, and there may have a problem in that the barrier performance of the film may lower. For forming the organic interlayer in the invention, for example, employable are a coating method and a vacuum evaporation method. The vacuum evaporation method is not specifically defined, but is preferably vapor deposition or plasma CVD for film formation. More preferred is a resistance-heating vapor deposition method in which the film-forming speed of the organic substance used may be readily controlled. The method of crosslinking the organic substance monomer used in the invention is not also specifically defined. Preferably, the monomer is crosslinked by electron rays or UV rays, since the ray source may be readily fitted to the vacuum chamber and since the monomer may be promptly crosslinked and polymerized. In case where the organic layer is formed according to a coating method, employable are various coating methods heretofore generally used in the art, such as a spray-coating method, a spin-coating method, and a bar-coating method.

Other Layers:

For the purpose or enhancing the reliability of the unit of silicon oxinitride layer/organic interlayer/silicon oxinitride layer, any other organic layer and silicon oxinitride layer may be further laminated on it. In such a case, however, it is desirable that the overall thickness of the laminated layers does not exceed 1500 nm.

The technique of determining the refractive index of each layer and controlling the influence of the optical interference of the interlayer reflected light on the laminate film to a desired optical characteristic by controlling the thickness of each layer is well known in the art. Needless-to-say, these may be well controlled not interfering with the barrier performance of the film.

If desired, any desired functional layer may be disposed between the gas-barrier laminate and the substrate film and/or outside the gas-barrier laminate and/or on the back of the substrate film. Examples of the functional layer that may be disposed between the gas-barrier laminate and the substrate film includes a planarizing layer, an adhesiveness-enhancing layer, a black matrix-containing light-shielding layer, an antireflection layer. They may be inorganic thin layers to be formed through CVD or PVD; or may be layers formed by applying a UV or electron-curable monomer, oligomer or resin to the structure according to a coating method or vapor deposition method, followed by curing it with UV rays or electron rays.

Similarly, any known functional layer may be disposed outside and/or inside the gas-barrier laminate seen from the substrate. Examples of the functional layer are known functional layers such as a protective layer for imparting scratch resistance to the structure, a soiling-resistant layer, an antistatic layer, an antireflection layer, an antiglare layer, an antiadhesive layer, a moisture-absorbent layer, a solvent-resistant layer, a color filter layer.

It is especially effective to dispose a transparent conductive layer of ITO, IZO or the like as the outermost layer of the gas-barrier film of the invention for using the film as the substrate of electronic devices. The transparent conductive layer may be formed according to known coating methods, for example, a vacuum film-forming method such as a sputtering method or an ion-plating method, or a sol-gel method. Especially preferred is a vacuum film-forming method in which the constitutive layers may be continuously formed with no necessity of restoration to atmospheric pressure in forming the gas-barrier laminate, in view of the production cost and of the ability to ensure the reliability and the interlayer adhesiveness of the laminate.

Since the gas-barrier film of the invention has good bending resistance, and can be produced according to a continuous roll-to-roll process. Further, since the composition of each constitutive layer is similar to each other, it is not necessary to severely partition the film-forming area for each layer, and the performance of the finished film is hardly degraded by contamination. Accordingly, the production cost may be reduced, and the reliability and the maintenance of the production facilities may be simplified. In particular, the advantage of the film is that it may well enjoy the merit of the roll-to-roll film-formation process.

Further, the same or a different substrate film may be put on the gas-barrier film of the invention via a heat-sealing material therebetween, for the purpose of protecting the film.

Substrate Film:

Not specifically defined, the substrate film for use in the gas-barrier film of the invention may be any one capable of supporting the above-mentioned constitutive layers thereon, and may be suitably selected depending on the use and the object of the film. Concretely, the substrate film may be formed of a thermoplastic resin such as polyester resin, methacrylic resin, methacrylic acid-maleic acid copolymer, polystyrene, transparent fluororesin, polyimide resin, fluorinated polyimide resin, polyamide resin, polyamidimide resin, polyetherimide resin, cellulose acylate resin, polyurethane resin, polyether-ether-ketone resin, polycarbonate resin, alicyclic polyolefin resin, polyarylate resin, polyether-sulfone resin, polysulfone resin, cycloolefin copolymer, fluorene ring-modified carbonate resin, alicyclic-modified polycarbonate resin, acryloyl compound. Of the resins, preferred are those having Tg of at least 120° C. Concrete examples (the parenthesized number indicates "glass transition temperature (Tg)") are films of polyester resins, especially polyethyl naphthalate resin (PEN: 121° C.), polyarylate resin (PAr: 210° C.), polyether-sulfone resin (PES: 220° C.), fluorene ring-modified carbonate resin (BCF-PC: compound of Example 4 in JP-A-2000-227603: 225° C.), alicyclic-modified polycarbonate resin (IP-PC: compound of Example 5 in JP-A-2000-227603: 205° C.), acryloyl compound (compound of Example 1 in JP-A-2002-80616: 300° C. or more).

We, the present inventors have found that, when Tg of the substrate film is 120° C. or higher, then the constitution is especially effective. In particular, we have fond that, when a silicon nitride film is formed through inductively-coupled plasma CVD, the highest temperature in the process that may be monitored by sticking a thermo-tape to the surface of the substrate may be 50° C. or lower, but when a film is formed on resin substrates having a different Tg under the same condition, then the barrier performance of the film is extremely high formed on substrates having Tg of around 100° C. or higher, and that of the film formed on substrates having Tg of 120° C. or higher is significantly bettered. Though not sufficiently analyzed, the reason would be because the formed film may have some influence on the condition of the extreme surface of the substrate film not detected by the thermo-tape.

When Tg of the substrate film is 120° C. or higher, then the barrier performance of the formed film is good. More preferably, Tg is 200° C. or higher, even more preferably 250° C. or higher.

In case where a highly heat-resistant substrate film is used, then it may be heated when a silicon oxinitride layer or a transparent conductive layer is formed thereon, and therefore, the heating may promote rearrangement of the molecules or the atoms. Accordingly, a gas-barrier film and a gas-barrier transparent conductive film of higher quality may be readily obtained.

Preferably, the substrate film in the invention does not take water therein in view of its property. Accordingly, it is desirable that the film is formed of a resin not having a hydrogen-bonding functional group. Preferably, the mean water content of the substrate film is at most 0.5% by mass, more preferably at most 0.1% by mass, even more preferably at most 0.05% by mass.

In general, when a substrate film is put into a vacuum chamber for layer lamination thereon, then water, residual solvent, surface-adsorbed component and minor low-molecular residual component may be released out from the surface of the substrate film. For forming a silicon oxinitride layer having a dense and tight structure, it is desirable to reduce the released components. Concretely, it is effective to introduce the substrate into a vacuum chamber before film formation thereon, or to preheat it for pretreatment so as to remove the leaving components from it. In this point, it is effective to use a highly heat-resistant substrate.

When the above-mentioned substrate film having a low water content is used, then the substrate film may be readily charged. The charging of the substrate film is an undesirable phenomenon since the film may adsorb particles to worsen the property of the barrier layer and since it may cause handling failure owing to surface blocking. Accordingly, to solve the problem, it is desirable that an antistatic layer is formed adjacent to the surface of the substrate film.

The antistatic layer is a layer having a surface resistivity at 50° C. and a relative humidity 30% of from 1 $\Omega$/square to $10^{13}$ $\Omega$/square. Preferably, the surface resistivity of the antistatic layer at 50° C. and a relative humidity 30% is from $1\times10^8$ $\Omega$/square to $1\times10^{13}$ $\Omega$/square, more preferably from $1\times10^8$ $\Omega$/square to $1\times10^{11}$ $\Omega$/square, even more preferably from $1\times10^8$ $\Omega$/square to $1\times10^9$ $\Omega$/square.

Image Display Device:

The use of the gas-barrier film of the invention is not specifically defined. Since the film is excellent in both its optical properties and mechanical properties, it is favorably used as a substrate for transparent electrodes for image display devices. "Image display devices" as referred to herein include circularly-polarizing plate, liquid-crystal display device, touch panel, organic EL device.

Circularly-Polarizing Plate:

The circularly-polarizing plate may be fabricated by laminating a λ/4 plate and a polarizing plate on the gas-barrier film of the invention. In this case, they are so laminated that the slow axis of the λ/4 plate could cross the absorption axis of the polarizing plate at an angle of 45°. The polarizing plate is preferably stretched in the 45°-direction relative to the machine direction (MD: longitudinal direction), and for example, those described in JP-A-2002-865554 are favorably used for it.

Liquid-Crystal Display Device:

The liquid-crystal display device may be grouped into a reflection-type liquid-crystal display device and a transmission-type liquid-crystal display device.

The reflection-type liquid-crystal display device has a constitution of a lower substrate, a reflection electrode, a lower alignment film, a liquid-crystal layer, an upper alignment film, a transparent electrode, an upper substrate a λ/4 plate, and a polarizing film laminated in that order from the lower side thereof. The gas-barrier film of the invention may be used as the transparent electrode and the upper substrate. When the reflection-type liquid-crystal display device is designed to have a color display function, then a color filter layer is disposed preferably between the reflection electrode and the lower alignment film, or between the upper alignment film and the transparent electrode.

The transmission-type liquid-crystal display device has a constitution of a backlight, a polarizing plate, a λ/4 plate, a lower transparent electrode, a lower alignment film, a liquid-crystal layer, an upper alignment film, an upper transparent electrode, an upper substrate, a λ/4 plate and a polarizing film laminated in that order from the lower side thereof. Of those, the gas-barrier film of the invention may be used as the upper transparent electrode and the upper substrate. When the transmission-type liquid-crystal display device is designed to have a color display function, then a color filter layer is disposed preferably between the lower transparent electrode and the lower alignment film, or between the upper alignment film and the upper transparent electrode.

Not specifically defined, the structure of the liquid-crystal layer is, for example, preferably a TN (twisted nematic) type, STN (super-twisted nematic) type, HAN (hybrid aligned nematic) type, VA (vertical alignment) type, ECB (electrically-controlled birefringence) type, OCB (optically-compensated bent) type, or CPA (continuous pinwheel alignment) type structure.

Touch Panel:

For the touch panel, referred to are those described in JP-A-5-127822 and JP-A-2002-48913, in which the gas-barrier film of the invention may be used for the substrate.

Organic EL Device:

The organic EL device has a cathode and an anode on the gas-barrier film of the invention, and has an organic compound layer containing an organic light-emitting layer (hereinafter this may be simply referred to as "light-emitting layer") between the two electrodes. Because of the property of the luminescent device, at least one electrode of the anode and the cathode is preferably transparent.

A preferred embodiment of the lamination of the organic compound layer in the invention comprises a hole transportation layer, a light-emitting layer and an electron transportation layer laminated in that order from the anode side. Further, a charge blocking layer may be formed between the hole transportation layer and the light-emitting layer, or between the light-emitting layer and the electron transportation layer. A hole injection layer may be formed between the anode and the hole transportation layer; and an electron injection layer may be formed between the cathode and the electron transportation layer. The light-emitting layer may be a single layer, or the light-emitting layer may be divided into a first light-emitting layer, a second light-emitting layer and a third light-emitting layer. Further, each layer may be divided into plural secondary layers.

The elements constituting the organic EL device of the invention are described in detail hereinunder.

Anode:

The anode generally has a function of an electrode that supplies a hole to the organic compound layer, and its shape, structure and size are not specifically defined. Depending on the use and the object of the luminescent device, known electrode materials may be suitably selected for forming the anode. As mentioned hereinabove, the anode is generally disposed as a transparent anode.

The anode material preferably includes, for example, metal, alloy, metal oxide, conductive compound and their mixture. Concrete examples of the anode material are conductive metal oxides such as antimony or fluorine-doped tin oxide (ATO, FTO), tin oxide, zinc oxide, indium oxide, indium tin oxide (ITO), indium zinc oxide (IZO); metals such as gold, silver, chromium, nickel; mixtures or laminates of these metals and conductive metal oxides; other inorganic conductive substances such as copper iodide, copper sulfide; organic conductive materials such as polyaniline, polythiophene, polypyrrole; and their laminates with ITO. Of those, preferred are conductive metal oxides; and more preferred is ITO in view of its producibility, high conductivity and transparency.

The anode may be formed on the substrate according to a method suitably selected from wet methods such as a printing method or a coating method, or physical methods such as a vacuum evaporation method, a sputtering method or an ion-plating method, or chemical methods such as CVD or plasma CVD, in consideration of the compatibility of the method with the material to constitute the anode. For example, when ITO is selected for the anode material, then the anode formation may be attained according to a direct-current or high-frequency sputtering method, a vacuum evaporation method or an ion-plating method.

In the organic EL device of the invention, the position for anode formation is not specifically defined, and it may be suitably selected in accordance with the use and the object of the device. Preferably, however, the anode is formed on the substrate. In this case, the anode may be formed entirely on one surface of the substrate, or partly thereon.

The patterning in forming the anode may be attained through chemical etching such as photolithography, or through physical etching with laser, or it may also be attained through vacuum evaporation or sputtering via a mask formed on the substrate, or may be attained according to a lift-off method or a printing method.

Not indiscriminately defined, the thickness of the anode may be suitably selected depending on the material to constitute the anode. In general, it may be from 10 nm to 50 μm or so, preferably from 50 nm to 20 μm.

The resistance value of the anode is preferably at most $10^3$ Ω/square, more preferably at most $10^2$ Ω/square. In case where the anode is transparent, it may be colorless transparent or may be colored and transparent. For taking out the emitted light from the side of the transparent anode, the transmittance through the anode is preferably at least 60%, more preferably at least 70%.

A transparent anode is described in detail in Yutaka Sawada's New Development of Transparent Electrode Film by CMC (1999), and the matters described therein may apply to the invention. In case where a plastic substrate that is poorly resistant to heat is used, then the anode is preferably a transparent anode formed of ITO or IZO at a low temperature not higher than 150° C.

(Cathode)

In general, the cathode may be any one having a function of an electrode to inject an electron into the organic compound layer, and its shape, structure and size are not specifically defined. Depending on the use and the object of the light-emitting device, the material for the cathode may be suitably selected from known electrode materials.

The material that constitutes the cathode includes, for example, metals, alloys, metal oxides, electroconductive compounds and their mixtures. Examples of the material are alkali metals (e.g., Li, Na, K, Cs), Group 2 metals (e.g., Mg, Ca), gold, silver, lead, aluminium, sodium-potassium alloy, lithium-aluminium alloy, magnesium-silver alloy; rare earth metals such as indium, ytterbium. One or more of these may be used herein either singly or as combined. From the viewpoint of satisfying both stability and electron injectability, at least two of them are preferably used as combined.

Of those, alkali metals and Group 2 metals are preferred for the material to constitute the cathode in view of their electron injectability. In particular, a material that comprises aluminium as the essential ingredient thereof is preferred as its storage stability is good.

The material comprising aluminium as the essential ingredient thereof includes aluminium alone, and alloys or mixtures of aluminium with from 0.01 to 10% by mass of an alkali metal or a Group 2 metal (e.g., lithium-aluminium alloy, magnesium-aluminium alloy) and their mixtures.

The cathode materials are described in detail in JP-A-2-15595 and JP-A-5-121172, and the material described in these publications are applicable also to the invention.

Not specifically defined, the cathode may be formed in any known method. For example, it may be formed according to a method suitably selected from wet methods such as a printing method or a coating method, or physical methods such as a vacuum evaporation method, a sputtering method or an ion-plating method, or chemical methods such as CVD or plasma CVD, in consideration of the compatibility of the method with the material to constitute the cathode. For example, when metals or the like are selected for the cathode material, then one or more of them may be sputtered simultaneously or successively to form the cathode.

The patterning in forming the cathode may be attained through chemical etching such as photolithography, or through physical etching with laser, or it may also be attained through vacuum evaporation or sputtering via a mask formed on the substrate, or may be attained according to a lift-off method or a printing method.

In the invention, the position for cathode formation is not specifically defined. The cathode may be formed entirely on the organic compound layer, or partly thereon.

A dielectric layer formed of an alkali metal or Group 2 metal fluoride or oxide, having a thickness of from 0.1 to 5 nm, may be interposed between the cathode and the organic compound layer. The dielectric layer may be considered as a type of an electron injection layer. The dielectric layer may be formed, fro example, according to a vacuum evaporation method, a sputtering method or an ion-plating method.

Not indiscriminately defined, the thickness of the cathode may be suitably selected depending on the material to constitute the cathode. In general, it may be from 10 nm to 5 μm or so, preferably from 50 nm to 1 μm.

The cathode may be transparent or non-transparent. The transparent cathode may be formed by laminating a transparent conductive material for the cathode such as ITO or IZO to form a thin layer having a thickness of from 1 to 10 nm.

Organic Compound Layer:

The organic compound layer in the invention is described.

The organic EL device of the invention has at least one organic compound layer that includes a light-emitting layer, in which the other organic compound layers than the organic light-emitting layer include, as so mentioned hereinabove, a hole transportation layer, an electron transportation layer, a charge blocking layer, a hole injection layer and an electron injection layer.

Formation of Organic Compound Layer:

In the organic EL device of the invention, the organic compound layers may be favorably formed according to a dry film formation method such as a vapor deposition method or a sputtering method, or any other method of a transfer method or a printing method.

Organic Light-Emitting Layer:

The organic light-emitting layer is a layer having the function of receiving a hole from an anode, a hole injection layer or a hole transportation layer and receiving an electron from a cathode, an electron injection layer or an electron transportation layer, when put in an electric field applied thereto, thereby providing a site for recombination of the hole and the electron to emit light.

In the invention, the light-emitting layer may be formed of a light-emitting material alone, or may be a mixed layer of a host material and a light-emitting material. The light-emitting material may be a fluorescent light-emitting material or a phosphorescent light-emitting material; and one or more dopants may be used for it. The host material is preferably a charge transportation material. One or more host materials may be used herein. For example, an electron-transporting host material and hole-transporting host material may be mixed. The light-emitting layer may contain a material which does not have the capability of charge transportation and does not emit light.

One or more light-emitting layers may be in the device, in which the layers may emit different colors.

In the invention, when two or more different types of light-emitting materials are selected and combined, then the device may emit any desired light. In particular, when the light-emitting materials are suitably selected, then a white light-emitting device may be fabricated having a high light emission efficiency and a high light emission brightness. For example, when light-emitting materials to give complementary colors are combined, for example, blue emission/yellow emission materials, light blue emission/orange emission materials, or green emission/violet emission materials are combined, then the device may emit white light. Further, a blue emission/green emission/red emission materials are combined, then the device may also emit white light.

The host material may serve also as a light-emitting material to emit light. For example, the light emission by the host material may be combined with the light emission by the light-emitting material, and the device may emit white light.

In the invention, one light-emitting layer may contain two or more different types of light-emitting materials; and the light-emitting layer may have a laminate structure of light-emitting material-containing layers, for example, like blue-emitting layer/green-emitting layer/red-emitting layer, or blue-emitting layer/yellow-emitting layer.

The following methods may be employed for controlling the color of the light to be emitted by the light-emitting layer. One or more of these methods may be employed herein for controlling the color of the light that the device of the invention emits.

1) A method of providing a color filter on the side on which light is taken out from the light-emitting layer, thereby controlling the emitted light.

The color filter defines the wavelength of the light that passes through it, thereby controlling the emitted light. The color filter may be formed on the transparent substrate according to a known thin film formation method of vacuum deposition or the like, using a known material. For example, a blue filter may be formed of cobalt oxide; a green filter may be formed of a mixture of cobalt oxide and chromium oxide; and a red filter may be formed of iron oxide.

2) A method of adding a material that promotes or retards light emission to the light-emitting layer, thereby controlling the emitted light.

For example, an assist dopant that receives energy from a host material and transfers the energy to a light-emitting material may be added, thereby facilitating the energy transfer from the host material to the light-emitting material. The assist dopant may be suitably selected from any known materials. For example, it may be selected from the materials mentioned below that are usable as the light-emitting material or the host material.

3) A method of adding a wavelength-converting material to a layer positioned on the side on which the emitted light is taken out from the light-emitting layer (including the transparent substrate), thereby controlling the color of the emitted light.

This material may be any known wavelength-converting material, and is, for example, it may be a fluorescence-converting substance capable of converting the light emitted by the light-emitting layer into any other light having a low-energy wavelength. The type of the fluorescence-converting substance may be suitably selected depending on the wavelength of the intended light to be emitted from the organic EL device and on the wavelength of the light emitted by the light-emitting layer. The amount of the fluorescence-converting substance to be used may be suitably selected, depending on the type thereof not causing the density loss of the emitted light. One or more different types of fluorescence-converting substances may be used herein either singly or as combined. When two or more different types of them are used, then the device may emit white light and intermediate color light apart from blue light, green light and red light, depending on their combination.

Examples of the fluorescent light-emitting material usable in the invention are, for example, benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, pyrralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidine compounds; various metal complexes such as typically metal complexes of 8-quinolinol derivatives, and metal complexes of pyrromethene derivatives; polymer compounds such as polythiophene, polyphenylene, polyphenylenevinylene; and organic silane compounds.

The phosphorescent light-emitting material usable in the invention includes, for example, complexes containing a transition metal atom or a lanthanoid atom.

Not specifically defined, the transition metal atom is preferably ruthenium, rhodium, palladium, tungsten, rhenium, osmium, iridium, platinum; more preferably rhenium, iridium, platinum.

The lanthanoid atom includes lanthanum, cerium, praseodymium, neodymium, samarium, europium, gadolinium, terbium, dysprosium, holmium, erbium, thulium, ytterbium, and lutecium. Of those lanthanoid atoms, preferred are neodymium, europium and gadolinium.

The ligands of the complexes are described, for example, in G. Wilkinson, et al's Comprehensive Coordination Chemistry, by Pergamon Press, 1987; H. Yersin's Photochemistry and Photophysics of Coordination Compounds, by Springer-Verlag, 1987; Akio Yamamoto's Organic Metal Chemistry, Bases and Applications, by Shokabo, 1982.

Preferred examples of the ligands are halogen ligands (preferably chlorine ligand), nitrogen-containing heterocyclic ligands (e.g., phenylpyridine, benzoquinoline, quinolinol, bipyridyl, phenanthroline), diketone ligands (e.g., acetylacetone), carboxylic acid ligands (e.g., acetic acid ligand), carbon monoxide ligand, isonitrile ligand, cyano ligand; and more preferred are nitrogen-containing heterocyclic ligands. The above complex may have one transition metal atom in the compound, or may also be a polynuclear complex having two or more transition metal atoms. It may have different types of metal atoms in one compound.

Preferably, the phosphorescent light-emitting material may be in the light-emitting layer in an amount of from 0.1 to 40% by mass, more preferably from 0.5 to 20% by mass.

The host material to be in the light-emitting layer in the invention includes those having a carbazole skeleton, those having a diarylamine skeleton, those having a pyridine skeleton, those having a pyrazine skeleton, those having a triazine skeleton and those having an arylsilane skeleton, as well as those shown in the sections of hole injection layer, hole transportation layer, electron injection layer and electron transportation layer described hereinunder.

Not specifically defined, the thickness of the light-emitting layer is, in general, preferably from 1 nm to 500 nm, more preferably from 5 nm to 200 nm, even more preferably from 10 nm to 100 nm.

Hole Injection Layer, Hole Transportation Layer:

The hole injection layer and the hole transportation layer are layers having the function of receiving a hole from an anode or from an anode side and transporting it to a cathode side. Concretely, the hole injection layer and the hole transportation layer are layers preferably containing any of carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, porphyrin compounds, organic silane derivatives, carbon.

The thickness of the hole injection layer and the hole transportation layer is preferably at most 500 nm each from the viewpoint of lowering the driving voltage.

The thickness of the hole transportation layer is preferably from 1 nm to 500 nm, more preferably from 5 nm to 200 nm, even more preferably from 10 nm to 100 nm. The thickness of the hole injection layer is preferably from 0.1 nm to 200 nm, more preferably from 0.5 nm to 100 nm, even more preferably from 1 nm to 100 nm.

The hole injection layer and the hole transportation layer may have a single-layered structure comprising one or more of the above-mentioned materials, or may have a multi-layered structure in which the plural layers may have the same or a different composition.

Electron Injection Layer, Electron Transportation Layer:

The electron injection layer and the electron transportation layer are layers having the function of receiving an electron from a cathode or from a cathode side and transporting it to an anode side. Concretely, the electron injection layer and the electron transportation layer are layers preferably containing any of triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives; aromatic tetracarboxylic acid anhydrides such as naphthalene, perylene; phthalocyanine derivatives; various metal complexes such as typically metal complexes of 8-quinolinol derivatives, and metal complexes having a ligand of metal phthalocyanine, benzoxazole or benzothiazole; and organic silane derivatives.

The thickness of the electron injection layer and the electron transportation layer is preferably at most 500 nm each from the viewpoint of lowering the driving voltage.

The thickness of the electron transportation layer is preferably from 1 nm to 500 nm, more preferably from 5 nm to 200 nm, even more preferably from 10 nm to 100 nm. The thickness of the electron injection layer is preferably from 0.1 nm to 200 nm, more preferably from 0.2 nm to 100 nm, even more preferably from 0.5 nm to 50 nm.

The electron injection layer and the electron transportation layer may have a single-layered structure comprising one or more of the above-mentioned materials, or may have a multi-layered structure in which the plural layers may have the same or a different composition.

For relaxing the energy barrier between the cathode and the light-emitting layer, the layer adjacent to the cathode may be doped with an alkali metal or an alkali metal compound. The organic layer may be reduced by the added metal or metal compound to give an anion, whereby the electron injectability may be increased and the voltage to be applied to the layer may lower. The alkali metal compound includes, for example, oxides, fluorides, lithium chelates.

Hole Blocking Layer:

The hole blocking layer is a layer having the function of preventing the hole transported from the anode side to the light emitting layer, from passing through toward the cathode side. In the invention, the hole blocking layer may be an organic compound layer that is adjacent to the light-emitting layer on the cathode side. As the case may be, the electron transportation layer and the electron injection layer may additionally have the function of the hole blocking layer.

Examples of the organic compound to constitute the hole blocking layer are aluminium complexes such as BAlq; triazole derivatives; phenanthroline derivatives such as BCP.

The thickness of the hole blocking layer is preferably from 1 to 500 nm, more preferably from 5 nm to 200 nm, even more preferably from 10 nm to 100 nm.

The hole blocking layer may have a single-layered structure comprising one or more of the above-mentioned materials, or may have a multi-layered structure in which the plural layers may have the same or a different composition.

A layer having the function of preventing the electron transported from the cathode side to the light-emitting layer, from passing through toward the anode side may be provided at the position adjacent to the light-emitting layer on the anode side. The hole transportation layer and the hole injection layer may additionally have the function of that layer.

Protective Layer:

The whole of the organic EL device of the invention may be protected by a protective layer.

The material to be in the protective layer may be any one having the function of preventing a substance that may promote the device degradation such as water and oxygen, from entering the device.

Examples of the material are metals such as In, Sn, Pb, Au, Cu, Ag, Al, Ti, Ni; metal oxides such as MgO, SiO, $SiO_2$, $Al_2O_3$, GeO, NiO, CaO, BaO, $Fe_2O_3$, $Y_2O_3$, $TiO_2$; metal nitrides such as SiNx, SiNxOy; metal carbides such as SiCw, SiOzCw; metal fluorides such as $MgF_2$, LiF, $AlF_3$, $CaF_2$; polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtained through copolymerization of a monomer mixture containing tetrafluoroethylene and at least one comonomer, fluorine-containing copolymers having a cyclic structure in the copolymer main chain, absorbent substances having an absorption degree of at least 1%, moisture-proof substances having an absorption degree of at most 0.1%.

The method for forming the protective layer is not specifically defined. For example, the layer may be formed according to a vacuum evaporation method, a sputtering method, a reactive sputtering method, an MBE (molecular beam epitaxial) method, a cluster ion beam method, an ion-plating method, a plasma polymerization method (high-frequency excited ion-plating method), a plasma CVD method, a laser CVD method, a thermal CVD method, a gas source CVD method, a coating method, a printing method, a transfer method.

Sealing:

As the case may be, the whole of the organic EL device of the invention may be sealed up in a housing.

If desired, a moisture absorbent or an inert liquid may be put in the space between the seal-up housing and the device. Not specifically defined, the moisture absorbent includes, for example, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide. Also not specifically defined, the inert liquid includes, for example, paraffins, liquid paraffins; fluorine-containing solvents such as perfluoroalkanes, perfluoroamines, perfluoroethers; chlorine-containing solvents, silicone oils.

A direct current (optionally containing an alternating current component) voltage (generally 2 V to 15 V) or a direct current is applied between the anode and the cathode in the organic EL device of the invention, whereupon the device emits light.

The driving methods described in JP-A-2-148687, 6-301355, 5-29080, 7-134558, 8-234685, 8-241047, Japanese Patent 2784615, and U.S. Pat. Nos. 5,828,429, 6,023,308 may apply to the organic EL device of the invention for driving it.

In case where the gas-barrier film of the invention is used in organic EL devices, it may serve as a substrate film and/or a protective film As the case may be, the gas-barrier laminate disposed on the substrate film in the invention may be disposed on the device in place of the substrate film thereof to seal it up. In the invention, it is desirable that, after an organic EL device has been fabricated, at least one three-layer unit consisting of a silicon oxinitride layer, a silicon carbide compound layer and a silicon oxinitride layer disposed in this order being adjacent with each other, is formed on it in vacuum, without exposing the device to air.

The preferred film thickness, composition and constitution may be the same as those of the gas-barrier laminate mentioned above, and they may be the same or different.

EXAMPLES

The characteristics of the invention are described more concretely with reference to the following Examples, in which the material used, its amount and the ratio, the details of the treatment and the treatment process may be suitably modified or changed not overstepping the gist of the invention. Accordingly, the invention should not be limitatively interpreted by the Examples mentioned below.

Example 1

Gas-barrier films (samples Nos. 1 to 20), comprising a gas-barrier laminate formed on a substrate film and a transparent conductive layer formed on the laminate, were fabricated according to the process mentioned below. The details of the structure of each gas-barrier film are shown in Table 1 and Table 2.

Fabrication of Gas-Barrier Films of the Invention (Samples Nos. 1 to 11):

1. Formation of Substrate Film:

A substrate film of a resin shown in Table 1, having a thickness of 100 µm, was prepared. In Table 1, PET is Toray's Lumilar T60; and PEN is Teijin-DuPont Film's Teonex Q65FA.

2. Formation of Gas-Barrier Laminate:

Using a roll-to-roll inductively-coupled plasma CVD device (1) shown in FIG. 1, an inorganic gas-barrier layer was formed on a substrate film. As in FIG. 1, the inductively-coupled plasma CVD device (1) has a vacuum chamber (2); and in the center part thereof, a drum (3) is disposed to cool a plastic film (6) that is kept in contact with its surface. In the vacuum chamber (2), disposed are a feed-out roll (4) and a take-up roll (5) for winding up the plastic film (6). The plastic film (6) would up around the feed-out roll (4) is wound around the drum (3) via a guide roll (7), the plastic film (6) is then wound around the take-up roll (5) via a guide roll (8). In the vacuum ventilation system thereof, the vacuum chamber (2) is all the time degassed by a vacuum pump (10) via a vent (9). The film formation system of the device comprises an RF power source (11) having an auto-matcher connected thereto and equipped with an induction coil for generating an induction field, and a gas introduction unit with a mass flow controller for introducing a vapor at a predetermined flow rate from a vapor cylinder to the vacuum chamber.

Concrete conditions in forming the gas-barrier laminate are described below.

The above substrate film is prepared as the plastic film (6), this is hung on the feed-out roll (4) and led to the take-up roll (5). After the substrate arrangement in the inductively-coupled plasma CVD device (1) has been finished, the vacuum chamber (2) is closed and the vacuum pump (10) is driven to start degassing from the chamber. When the ultimate vacuum degree has reached $4 \times 10^{-4}$ Pa, a silane gas diluted to 5% with nitrogen as a reactive gas is introduced into the chamber, then the discharge power source (11) is put on, and a high frequency of 13.56 MHz is applied to the chamber at a discharge power of 1000 W. Then, the discharge stability is confirmed, and the plastic film (6) is made to start to run, and a layer of silicon oxinitride is deposited thereon until it is wound up around the take-up roll (5).

Next, TEOS is introduced into the chamber, then the discharge power source (11) is put on, and a high frequency of 13.56 MHz is applied to it at a discharge power of 1000 W. Then, the discharge stability is confirmed, and the running direction of the film is inverted to the opposite direction, and an organic interlayer is deposited thereon until it is wound up around the feed-out roll (4).

Next, a silane gas diluted to 5% with nitrogen as a reactive gas is again introduced into the chamber, then the discharge power source (11) is put on, and a high frequency of 13.56 MHz is applied to the chamber at a discharge power of 1000 W. Then, the discharge stability is confirmed, and the plastic film (6) is made to start to run, and a layer of silicon oxinitride is deposited thereon until it is wound up around the take-up roll (5).

The film-forming condition for the silicon oxinitride layer and the organic interlayer of the samples produced herein, and the composition of the silicon oxinitride layer and the organic interlayer formed are shown in Table 3 and Table 4.

Fabrication of Gas-Barrier Film of the Invention (Sample No. 12):

A gas-barrier film of the invention (sample No. 12) was fabricated in the same manner as that for the above sample No. 2, in which, however, an interlayer was formed in place of the organic interlayer in No. 2, in the manner as follows: A silane gas diluted to 5% with nitrogen as a reactive gas is introduced into the chamber, then the discharge stability at the film formation pressure is confirmed, and a methane gas is introduced to form the interlayer having a thickness of 300 nm. The element ratio of the interlayer, as analyzed through ESCA, was C/O/Si=100/82/91.

Fabrication of Gas-Barrier Film of the Invention (Sample No. 13):

A sample No. 13 was fabricated in the same manner as that for the above sample No. 12, in which, however, the organic interlayer was formed without silane introduction.

Fabrication of Gas-Barrier Film of the Invention (Sample No. 14):

A sample No. 14 was fabricated in the same manner as that for the above sample No. 2, in which, however, the organic interlayer was formed according to the following process:

An acryl monomer mixture comprising 50.75 ml of tetraethylene glycol diacrylate, 14.5 ml of tripropylene glycol monoacrylate, 7.25 ml of caprolactone acrylate, 10.15 ml of acrylic acid and 10.15 ml of SarCure (Sartomer's benzophenone mixture photopolymerization initiator) was mixed with 36.25 mg of solid N,N'-bis(3-methylphenyl)-N,N'-diphenylbenzidine particles, and stirred in a 20-kHz tissue mincer for about 1 hour. With heating at about 45° C. and stirring for preventing precipitation, the mixture was fed into a 1.3-mm spray nozzle via a capillary having an inner diameter of 2.0 mm and a length of 61 mm, by a pump, and this was sprayed through a 25-kHz ultrasonic spray to give spray droplets and applied onto the surface of a film kept at about 340° C. Water vapor was cryo-coagulated on the film kept in contact with a chill drum at a temperature of about 13° C., and then this was UV-cured with a high-pressure mercury lamp (total irradiation dose, about 2000 mJ/cm$^2$) to form an organic layer thereon. The film thickness was about 300 nm.

Fabrication of Gas-Barrier Film of the Invention (Sample No. 15):

A commercially-available, batch-type magnetron sputtering device (by Shibaura Mechatronics) was used. The same substrate film (PEN film) as that used for the above sample No. 2 was kept degassed to a vacuum level of $10^{-4}$ Pa, then a discharge gas, argon was introduced into the device to have a partial pressure of 0.5 Pa. After the pressure became stable, discharging the system was started, and a plasma was generated on the $Si_3N_4$ target to start a sputtering process. After the process became stable, the shutter was opened, and forming a first silicon oxinitride layer on the film was started. When a 100 nm film was deposited, the shutter was shut and the film formation was finished. The elementary ratio of the silicon oxinitride film formed under the condition was determined through Electron Spectroscopy for chemical analysis (ESCA), and was O/N=30/70. Air was introduced into the vacuum chamber, and the film with the silicon oxinitride layer formed thereon was taken out.

Next, a 300 nm-thick organic interlayer was formed on the first silicon oxinitride layer in the same manner as that for forming the organic interlayer in the above-mentioned sample No. 2. Further, a 100 nm-thick, second silicon oxinitride layer was formed on the organic interlayer in the same manner as that for forming the above first silicon oxinitride layer, thereby fabricating a gas-barrier film of the invention (sample No. 15).

Fabrication of Comparative Gas-Barrier Film (Sample No. 16):

A comparative gas barrier-film (sample No. 16) was fabricated in the same manner as that for the above sample No. 2, in which, however, the organic interlayer was omitted.

Fabrication of Comparative Gas-Barrier Film (Sample No. 17):

A comparative gas-barrier film (sample No. 17) was fabricated in the same manner as that for the above sample No. 2, in which, however, an interlayer was formed in place of the organic interlayer in No. 2, in the manner as follows: A silane gas diluted to 5% with nitrogen as a reactive gas is introduced into the chamber, then the discharge stability at the film formation pressure is confirmed, and an oxygen gas diluted to 5% with nitrogen was introduced into the device at a flow rate of 1/10 of that of the above diluted silane gas, thereby forming the interlayer having a thickness of 300 nm. The element ratio of the interlayer, as analyzed through ESCA, was O/N=2/98.

Fabrication of Comparative Gas-Barrier Film (Sample No. 18):

An organic interlayer was directly formed on a substrate film, according to the process of forming the organic interlayer of the above sample No. 14.

Next, an N-rich, first silicon oxinitride layer was formed on it, in the same manner as that for forming the silicon oxinitride layer in the above sample No. 15, except that the film thickness was changed to 5 nm. The element ratio of the first silicon oxinitride layer, as analyzed through ESCA, was O/N=30/70.

Next, an O-rich, second silicon oxinitride layer was formed on it, in the same manner as that for forming the first silicon oxinitride layer, for which, however, oxygen gas was additionally introduced at 0.005 Pa to the reactive gas in the film formation and the film thickness was 95 nm, thereby fabricating a comparative gas-barrier film (sample No. 18). The element ratio of the second silicon oxinitride layer, as analyzed through ESCA, was O/N=33/67.

Figure 2:
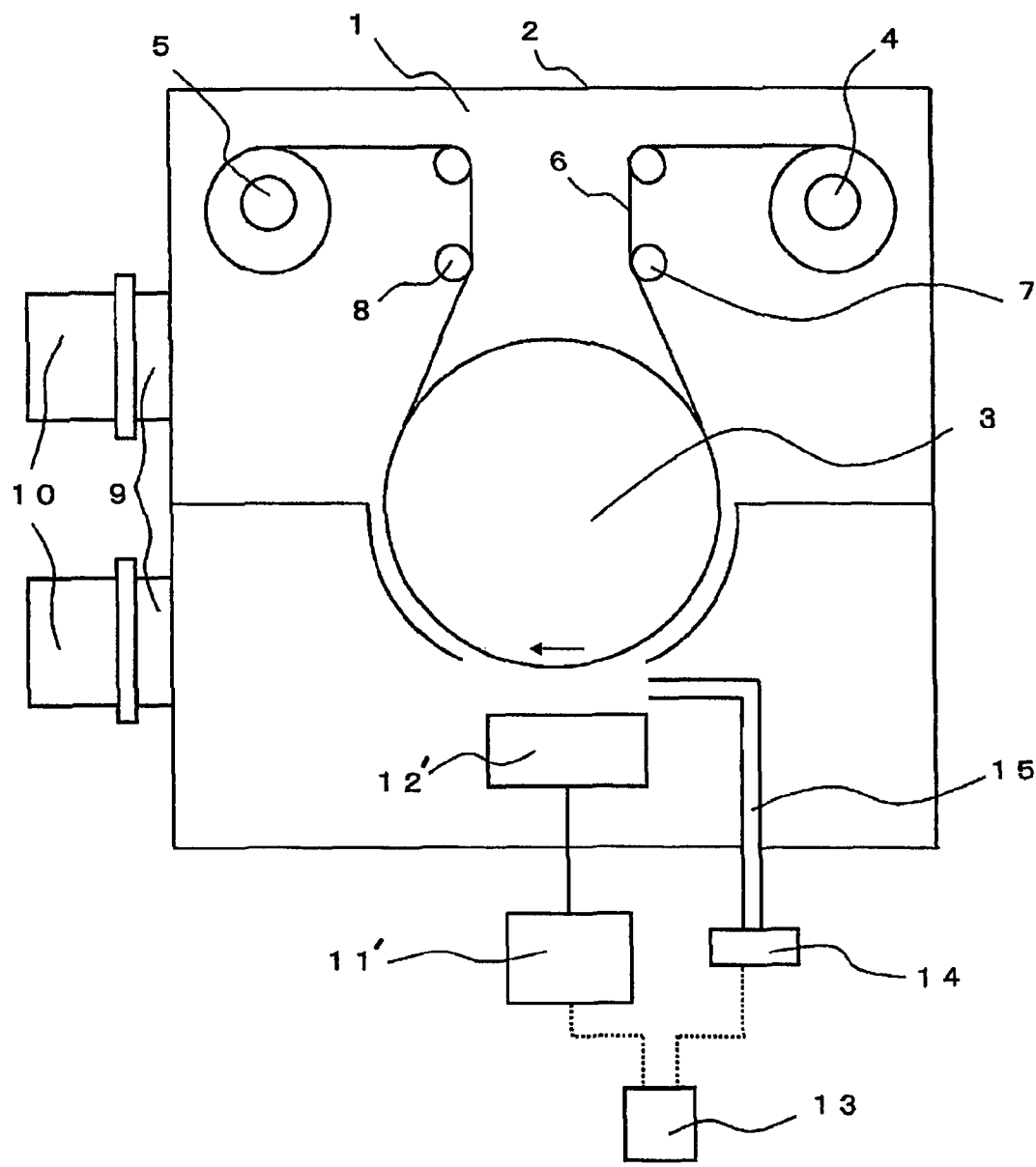
FIG. 2 is an explanatory view showing a sputtering device used for producing samples Nos. 15, and 18 to 20.

Fabrication of Comparative Gas-Barrier Films (Sample Nos. 19, 20):

1. Formation of Inorganic Layer:

Similar to FIG. 1, a roll-to-roll sputtering device (1) of FIG. 2 was used. The device has a vacuum chamber (2); and in the center part thereof, a drum (3) is disposed to cool a plastic film (6) that is kept in contact with its surface. In the vacuum chamber (2), disposed are a feed-out roll (4) and a take-up roll (5) for winding up the plastic film (6). The plastic film (6) would up around the feed-out roll (4) is wound around the drum (3) via a guide roll (7), and the plastic film (6) is then wound around the roll (5) via a guide roll (8). In the vacuum ventilation system thereof, the vacuum chamber (2) is all the time degassed by a vacuum pump (10) via a vent (9). In the film formation system of the device, a target (not shown) is mounted on a cathode (12') connected to a direct-current discharge power source (11') to which a pulse power is applied. The discharge power source (11') is connected to a controller (13), and the controller (13) is connected with a gas flow rate control unit (14) that feeds a reactive gas to the vacuum chamber (2) via a duct (15) with controlling the gas flow rate. The vacuum chamber (2) is so designed (not illustrated) that a discharge gas may be fed therein at a predetermined flow rate. Concrete conditions in film formation are described below.

Si is set as a target, and a pulse-system direct current source is prepared as the discharge power source (11'). The same substrate film (PEN film) as that used in fabricating the above sample No. 2 is prepared as the plastic film (6). This is hung around the feed-out roll (4) led to the take-out roll (5). After the substrate arrangement in the sputtering device (1) has been finished, the vacuum chamber (2) is closed and the vacuum pump (10) is driven to start degassing from the chamber and cooling the drum. When the ultimate vacuum degree has reached $4 \times 10^{-4}$ Pa and when the drum temperature has reached 5° C., the plastic film (6) is made to start to run. Argon is introduced into the chamber as a discharge gas, and the discharge power source (11') is put on. A plasma is thus generated on the Si target at a discharge power of 5 kW and under a film-forming pressure of 0.3 Pa, and the target is pre-sputtered for 3 minutes. Next, oxygen is introduced into the chamber as a reactive gas. After the discharging has become stable, the amount of argon and oxygen gas is gradually reduced, and the film-forming pressure is lowered to 0.1 Pa. The discharge stability at 0.1 Pa is confirmed, and then a silicon oxide film is formed for a predetermined period of time. After the film formation, the vacuum chamber (2) is restored to an atmospheric pressure, and the silicon oxide-coated film is taken out. The coating film thickness was about 50 nm.

2. Formation of Organic Interlayer:

An organic interlayer was formed on it, in the same manner as that for forming the organic interlayer of the above sample No. 14.

3. Alternate Formation of Inorganic Layer/Organic Layer, and Formation of Transparent Conductive Layer:

In the same manner as in 1, an inorganic layer (SiOx layer) was formed on the above 1 and 2, thereby forming a gas-barrier laminate (having three layers in total). This is a comparative gas-barrier film (sample No. 19).

Further, another comparative gas barrier film (sample No. 20) was fabricated in the same manner as that for the sample No. 19, for which, however, the layers 1 and 2 were alternately formed three times each, between the layers 1 and 2 and the inorganic layer.

Formation of Transparent Conductive Layer:

The sample prepared in the above was put into the vacuum chamber of a commercially-available batch-type magnetron sputtering device (by Shibaura Mechatronics), in which an indium tin oxide (ITO, indium/tin=95/5 by mol) anode (thickness, 0.2 μm) was formed thereon using a direct current power source.

In the manner as above, transparent conductive layer-coated gas-barrier films (samples Nos. 1 to 20) were obtained.

Assessment of Physical Properties of Gas-Barrier Films:

Using the devices mentioned below, the physical properties of the gas-barrier films produced were assessed. The results are given in Table 1 and Table 2.

Layer Constitution (Film Thickness):

Hitachi's scanning electronic microscope, Model S-900.

Water Vapor Permeability (g/m²·day):

MOCON's PERMATRAN-W3/31 (condition: 40° C., relative humidity 90%).

Atomic Composition Ratio:

Kratos Analytical's ESCA3400.

Example 2

Fabrication of Organic EL Device (I):

On the above-mentioned, transparent conductive layer-coated gas-barrier film (samples Nos. 1 to 20) having a size of 25 mm×25 mm, formed was an indium tin oxide (ITO, indium/tin=95/5 by mol) anode (thickness 0.2 μm) according to a sputtering method and using a direct current source. On the anode, formed was a hole injection layer of copper phthalocyanine (CuPc, 10 nm) according to a vacuum evaporation method; and a hole transportation layer of N,N'-dinaphthyl-N,N'-diphenylbenzidine (40 nm) was formed on it according to a vacuum evaporation method. With that, a host material of 4,4'-N,N'-dicarbazole-biphenyl, a blue-emitting material of bis[4,6-difluorophenyl)-pyridinato-N,C2'](picolinate)iridium complex (Firpic), a green-emitting material of tris(2-phenylpyridine)iridium complex (Ir(ppy)$_3$), and a red-emitting material of bis(2-phenylquinoline)acetylacetonato/iridium were co-deposited on it, in a ratio of 100/2/4/2 by mass, thereby forming a light-emitting layer having a thickness of 40 nm thereon. Further on it, an electron-transporting material of 2,2',2"-(1,3,5-benzenetriyl)tris[3-(2-methylphenyl)-3H-imidazo[4,5-b]pyridine] was deposited at a speed of 1 nm/sec, thereby forming an electron transportation layer having a thickness of 24 nm thereon. A patterned mask (to give a light-emitting area of 5 mm×5 mm) was put on the organic compound layer, and in a vacuum evaporation device, lithium fluoride was deposited thereon to have a thickness of 1 nm and aluminium was further deposited thereon to have a thickness of 100 nm, thereby forming a cathode on the layer. Aluminium lead wires were led out from the anode and the cathode to fabricate a light-emitting device. The device was put in a globe box purged with nitrogen gas, and this was sealed up with a glass cap, using a UV-curable adhesive (Nagase-Ciba's XNR5493) to complete a light-emitting device.

Fabrication of Organic EL Device (II):

Using the gas-barrier film (samples Nos. 1 to 19), a light-emitting device was fabricated in the same manner as that for fabricating the above organic EL device (I). This was sealed up under the same condition as that for the barrier layer constitution of the corresponding substrate film, in place of sealing it with a glass cap.

Bending Resistance Test—Fabrication of Organic EL Device (III):

An organic EL device (III) was prepared in the same manner as that for the above EL device (1) except for the following: The gas-barrier film was cut into a piece having a size of 30 mm×200 mm. In a bending tester, Coating Tester Industry's Cylindrical Mandrel Method Type I Model, the film piece was set around the 12 mm-diameter cylinder, and repeatedly bent around it at 180 degrees with the barrier surface of the film as outside, or that is, the piece was kept in the bent condition (180 degrees) and the non-bent condition repeatedly for 100 times. This was used as the substrate in the device (III).

Durability Assessment of Organic EL Devices (I) to (III):

Using a Source Measure Unit Model 2400 (by Toyo Technica), a direct current was applied to the organic EL devices (I) to (III) fabricated in the manner as above, for light emission. As a result, all the device samples well emitted light.

Next, after their fabrication, the organic EL devices were left at 60° C. and relative humidity of 90% for 500 hours, and then driven in the same manner as above for light emission. The proportion of the light-emitting area to the overall area of each sample (the area with no light emission is a dark spot) was determined, using Nippon Poladigital's Microanalyzer.

The results of Examples 1 and 2 are shown in Table 1 below.

TABLE 1

| Sample No. | Constitution | Substrate Film Constitutive Resin | Substrate Film Glass Transition Temperature (°C.) | Silicon Oxinitride Layer Condition for Film Formation | Interlayer Condition for Film Formation | Composition Ratio, Si/O/N in Silicon Oxinitride Layer (The numeral in the parenthesis indicates composition ratio of O/N.) | Composition Ratio, C/O/Si in interlayer (The numeral in the parenthesis indicates composition ratio of Si/(C + O + Si).) |
|---|---|---|---|---|---|---|---|
| 1 | i | PET | 77 | A | a | 1:0.81:0.80 (1.0) | 1:0.35:0.18 (0.12) |
| 2 | i | PEN | 121 | A | a | 1:0.81:0.81 (1.0) | 1:0.40:0.20 (0.13) |
| 3 | i | PEN | 121 | B | a | 1:0.81:0.80 (1.0) | 1:0.38:0.19 (0.14) |
| 4 | i | PEN | 121 | C | a | 1:0.33:1.11 (0.30) | 1:0.39:0.21 (0.12) |
| 5 | i | PEN | 121 | D | a | 1:0.18:1.2 (0.15) | 1:0.38:0.17 (0.14) |
| 6 | i | PEN | 121 | E | a | 1:1.49:0.33 (4.5) | 1:0.39:0.21 (0.13) |
| 7 | i | PEN | 121 | F | a | 1:1.54:0.28 (5.5) | 1:0.37:0.21 (0.13) |
| 8 | i | PEN | 121 | G | a | 1:1.52:0.31 (4.9) | 1:0.38:0.18 (0.12) |
| 9 | i | PEN | 121 | H | a | 1:0.30:1.14 (0.26) | 1:0.42:0.21 (0.13) |
| 10 | i | PEN | 121 | I | a | 1:0.77:0.66 (1.1) | 1:0.40:0.18 (0.11) |
| 11 | i | PEN | 121 | J | a | 1:1.44:0.33 (4.4) | 1:0.40:0.22 (0.14) |
| 12 | ii | PEN | 121 | A | b | 1:0.82:0.91 (0.90) | 1:0.25:0.22 (0.15) |
| 13 | iii | PEN | 121 | A | d | 1:0.82:0.91 (0.90) | 1:0.81:0 (0) |
| 14 | iv | PEN | 121 | A | c | 1:0.81:0.80 (1.0) | 1:0.79:0 (0) |
| 15 | v | PEN | 121 | — | a | 1:0.84:0.77 (1.1) | 1:0.36:0.22 (0.14) |
| 16 | vi | PEN | 121 | A | — | 1:0.81:0.80 (1.0) | — |
| 17 | vii | PEN | 121 | A | e | 1:0.81:0.81 (1.0) | 0:1.85:1 (0.35) |
| 18 | viii | PEN | 121 | — | — | 1st) 1:0.44:1.02 (0.43) 2nd) 1:1.1:0.5 (1.96) | 1:0.8:0 (0) |
| 19 | ix | PEN | 121 | — | c | — | 1:0.8:0 (0) |
| 20 | x | PEN | 121 | — | c | — | 1:0.8:0 (0) |

| Sample No. | Water Vapor Permeability (g/m²·day) | Proportion of Light-Emitting Are of Organic EL Device, after aged at 60° C. and relative humidity 90% for 500 hours — Organic EL Device (I) | Organic EL Device (II) | Organic EL Device (III) | Winding Frequency in Sample Fabrication | Remarks |
|---|---|---|---|---|---|---|
| 1 | <0.01(*) | 66% | 65% | 62% | 3 times | the Invention |
| 2 | <0.01(*) | 98% | 96% | 95% | 3 times | the Invention |
| 3 | <0.01(*) | 89% | 85% | 84% | 3 times | the Invention |
| 4 | <0.01(*) | 87% | 85% | 83% | 3 times | the Invention |
| 5 | <0.01(*) | 75% | 68% | 67% | 3 times | the Invention |
| 6 | <0.01(*) | 88% | 86% | 85% | 3 times | the Invention |
| 7 | <0.01(*) | 74% | 72% | 71% | 3 times | the Invention |
| 8 | <0.01(*) | 78% | 78% | 77% | 3 times | the Invention |
| 9 | <0.01(*) | 77% | 71% | 69% | 3 times | the Invention |
| 10 | <0.01(*) | 92% | 90% | 89% | 3 times | the Invention |
| 11 | <0.01(*) | 93% | 90% | 88% | 3 times | the Invention |
| 12 | <0.01(*) | 97% | 96% | 95% | 3 times | the Invention |
| 13 | <0.01(*) | 97% | 96% | 95% | 3 times | the Invention |
| 14 | <0.01(*) | 97% | 85% | 78% | 3 times | the Invention |
| 15 | <0.01(*) | 95% | 92% | 75% | 3 times | the Invention |
| 16 | <0.01(*) | 98% | 80% | No L.E. | 3 times | Comparative |
| 17 | <0.01(*) | 99% | 97% | 22% | 3 times | Comparative |
| 18 | <0.01(*) | 97% | 86% | No L.E. | 3 times | Comparative |
| 19 | <0.01(*) | 18% | No L.E. | No L.E. | 3 times | Comparative |
| 20 | <0.01(*) | 94% | 89% | 88% | 5 times | Comparative |

(*)means lower than the detection limit.
No L.E. means no light emission.

TABLE 2

| Constitution | Layer Constitution (The numeral in the parenthesis is the thickness of the layer.) | Formation Method for $SiO_x$ or $SiO_xN_y$ |
|---|---|---|
| i | substrate film/$SiO_xN_y$ (100 nm)/organic interlayer from TEOS (300 nm)/$SiO_xN_y$ (100 nm) | CVD |
| ii | substrate film/$SiO_xN_y$ (100 nm)/organic interlayer from $CH_4$ + $SiH_4$ (300 nm)/$SiO_xN_y$ (100 nm) | CVD |
| iii | substrate film/$SiO_xN_y$ (100 nm)/organic interlayer from $CH_4$ (300 nm)/$SiO_xN_y$ (100 nm) | CVD |
| iv | substrate film/$SiO_xN_y$ (100 nm)/organic interlayer from acrylate cured layer (300 nm)/$SiO_xN_y$ (100 nm) | CVD |
| v | substrate film/$SiO_xN_y$ (100 nm)/organic interlayer from TEOS (300 nm)/$SiO_xN_y$ (100 nm) | sputtering |
| vi | substrate film/$SiO_xN_y$ (100 nm)/$SiO_xN_y$ (100 nm) | CVD |
| vii | substrate film/$SiO_xN_y$ (100 nm)/$SiO_z$ (300 nm)/$SiO_xN_y$ (100 nm) | CVD |
| viii | substrate film/organic interlayer from acrylate cured layer (300 nm)/$SiO_xN_y$ (5 nm; N-rich)/$SiO_xN_y$ (95 nm; O-rich) | sputtering |

TABLE 2-continued

| Constitution | Layer Constitution (The numeral in the parenthesis is the thickness of the layer.) | Formation Method for $SiO_x$ or $SiO_xN_y$ |
|---|---|---|
| ix | substrate film/$SiO_x$ (100 nm)/organic interlayer from acrylate cured layer (300 nm)/$SiO_x$ (50 nm) | sputtering |
| x | substrate film/{$SiO_x$ (100 nm)/organic interlayer from acrylate cured layer (300 nm)}x4/$SiO_x$ (50 nm) | sputtering |

*"$SiO_x$" means silicon oxide; and $SiO_xN_y$ means silicon oxinitride.

TABLE 3

| Condition for Forming Silicon Oxinitride Layer | Flow Rate of Silane Gas (diluted with 5% $N_2$) [sccm] | Flow Rate of Oxygen (diluted with 5% $N_2$) [sccm] | Pressure in Film Formation [Pa] |
|---|---|---|---|
| A | 200 | 10 | 0.6 |
| B | 200 | 10 | 1.0 |
| C | 200 | 5 | 0.6 |
| D | 200 | 2 | 0.6 |
| E | 200 | 20 | 0.6 |
| F | 200 | 25 | 0.6 |
| G | 200 | 20 | 0.9 |
| H | 200 | 5 | 0.4 |
| I | 200 | 10 | 0.3 |
| J | 200 | 20 | 1.0 |

TABLE 4

| Condition for Forming Interlayer | Material | Flow Rate of TEOS [sccm] | Flow Rate of Silane Gas (diluted with 5% $N_2$) [sccm] | Flow Rate of $CH_4$ Gas [sccm] | Flow Rate of Oxygen (diluted with 5% $N_2$) [sccm] | Flow Rate of Nitrogen [sccm] | Pressure in Film Formation [Pa] |
|---|---|---|---|---|---|---|---|
| a | TEOS | 50 | — | — | — | 150 | 0.60 |
| b | $CH_4$ + $SiH_4$ | — | 200 | 50 | — | — | 0.65 |
| c | acrylate mixture* | — | — | — | — | 100 | 0.62 |
| d | $CH_4$ | — | — | 50 | — | 150 | 0.61 |
| e | $SH_4$ + $O_2$ | — | 200 | — | 5 | — | 0.62 |

*See the above description.

As obvious from the results in Table 1, the gas-barrier films of the invention (samples Nos. 1 to 15) may provide organic electroluminescent devices of higher durability and higher bending resistance than the comparative gas-barrier films (samples Nos. 16 to 20).

The samples Nos. 2 to 15 fabricated in the same manner as that for the sample No. 1 but using a film substrate of a constitutive resin having a higher glass transition temperature than in the sample No. 1 may provide organic electroluminescent devices of higher durability than the samples Nos. 2 to 15.

The sample No. 2 has higher bending resistance than the samples Nos. 17 and 18 having a similar constitution to it, and it may provide a substrate film suitable for use as a flexible film.

On the other hand, the gas-barrier films of the invention (samples Nos. 1 to 15) may significantly reduce the necessary roll-winding frequency in their production, as compared with the comparative gas-barrier film (sample No. 20). (As is obvious from comparison with the sample No. 19, the comparative film produced at the same winding frequency as that for the film of the invention has poor quality.) Accordingly, the invention provides gas-barrier films of better quality according to an efficient production process at high producibility.

Since the gas-barrier film of the invention has excellent transparency and gas-barrier performance, and is therefore favorably used for substrates and coating films of various devices. The image display device substrate and the organic EL device of the invention have high bending resistance and durability enough to give flexibility. Further, as compared with the prior-art technique, the invention has high producibility. Accordingly, the industrial applicability of the invention is excellent.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 084628/2006 filed on Mar. 27, 2006, which is expressly incorporated herein by reference in its entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas-barrier film comprising a substrate film and a gas-barrier laminate on the substrate film, wherein the gas-barrier laminate comprises at least one three-layer unit consisting of a first silicon oxynitride layer, an organic interlayer directly on the first silicon oxynitride layer and a second silicon oxynitride layer directly on the organic interlayer, wherein the constitution ratio of oxygen to nitrogen (oxygen/nitrogen) in at least one of the silicon oxynitride layers is from 0.2 to 5, wherein the gas barrier laminate is provided on the surface of the substrate film, and wherein the substrate film is a thermoplastic resin film having a glass transition temperature of 120° C. or higher.

2. The gas-barrier film according to claim 1, which has a water-vapor permeability at 40° C. and a relative humidity 90% of at most 0.02 g/m²day.

3. The gas-barrier film according to claim 1, wherein the organic interlayer comprises silicon and oxygen.

4. The gas-barrier film according to claim 3, wherein at least one layer of the silicon oxinitride layers or the organic interlayer is formed through inductively-coupled plasma CVD.

5. The gas-barrier film according to claim 1, wherein the organic interlayer contains silicon.

6. The gas-barrier film according to claim 1, wherein the organic interlayer comprises a cured acrylate compound.

7. The gas-barrier film according to claim 1, which comprises a transparent conductive layer on the gas-barrier laminate.

8. The gas-barrier film according to claim 1, which is produced according to a process where the substrate film is fed in a roll-to-roll system and the gas-barrier laminate is continuously formed thereon.

9. A substrate film for image display devices, which comprises the gas-barrier film of claim 1.

10. An organic electroluminescent device, which comprises the substrate film for image display devices of claim 9.

11. An organic electroluminescent device fabricated by forming a film of the organic electroluminescent device of claim 10, then providing, in an vacuum not exposing it to air, at least one three-layer unit consisting of a silicon oxinitride layer, an organic interlayer and a silicon oxinitride layer disposed in this order being adjacent with each other, and sealing it up.

12. The gas-barrier film according to claim 1, wherein the first and second silicon oxynitride layers are represented by formula $SiO_xN_y$, wherein $0.2 < x/y < 5.0$, and wherein $0.9 < (2x+3y)/4 < 1.1$.

13. The gas-barrier film according to claim 1, wherein the refractive index of the first and second silicon oxynitride layers is from 1.7 to 2.1.

14. The gas-barrier film according to claim 1, wherein silicon, oxygen and nitrogen comprise 98 mass% or more of the first and second silicon oxynitride layers.

15. The gas-barrier film according to claim 1, wherein the substrate film has a glass transition temperature of 120° C. or higher.

16. The gas-barrier film according to claim 1, wherein silicon, oxygen and nitrogen comprise 98 mass% or more of the first and second silicon oxynitride layers, and wherein the substrate film has a glass transition temperature of 120° C. or higher.

17. The gas-barrier film according to claim 1, wherein the substrate film is a polyester resin.

* * * * *